(12) United States Patent
Krasnov et al.

(10) Patent No.: US 6,863,699 B1
(45) Date of Patent: Mar. 8, 2005

(54) SPUTTER DEPOSITION OF LITHIUM PHOSPHOROUS OXYNITRIDE MATERIAL

(75) Inventors: Victor Krasnov, Tarzana, CA (US); Kai-Wei Nieh, Monrovia, CA (US); Su-Jen Ting, Encino, CA (US); Paul Tang, Northridge, CA (US); Fan-Hsiu Chang, Miao-Li (TW); Chun-Ting Lin, Taichung (TW)

(73) Assignee: Front Edge Technology, Inc., Baldwin Park, CA (US)

( * ) Notice: Subject to any disclaimer, the term of this patent is extended or adjusted under 35 U.S.C. 154(b) by 0 days.

(21) Appl. No.: 09/705,962

(22) Filed: Nov. 3, 2000

(51) Int. Cl.[7] .................... C23C 14/00; C23C 14/32; H01M 6/00
(52) U.S. Cl. ................... 29/623.1; 204/192.15; 204/298.16; 204/298.19
(58) Field of Search .................. 429/322, 321; 209/192.15, 192.22, 298.19, 298.16; 29/623.11

(56) References Cited

U.S. PATENT DOCUMENTS

| | | | |
|---|---|---|---|
| 3,530,007 A | | 9/1970 | Golubovic |
| 4,543,441 A | | 9/1985 | Kumada et al. |
| 5,019,467 A | | 5/1991 | Fujiwara |
| 5,262,028 A | * | 11/1993 | Manley .................. 204/192.12 |
| 5,338,625 A | * | 8/1994 | Bates et al. .................. 429/193 |
| 5,445,906 A | | 8/1995 | Hobson et al. |
| 5,512,147 A | | 4/1996 | Bates et al. |
| 5,597,660 A | | 1/1997 | Bates et al. |
| 5,612,152 A | | 3/1997 | Bates |
| 5,705,293 A | | 1/1998 | Hobson |
| 5,705,297 A | | 1/1998 | Warren |
| 6,168,884 B1 | | 1/2001 | Neudecker et al. |
| 6,280,875 B1 | | 8/2001 | Kwak et al. |

FOREIGN PATENT DOCUMENTS

| JP | 59 226472 A | 12/1984 |
|---|---|---|
| JP | 2001 044073 A | 2/2001 |
| WO | WO 00 60689 A | 10/2000 |
| WO | WO 02 21627 A | 3/2002 |

OTHER PUBLICATIONS

Handbook of Physical Vapor Deposition (PVD) Processing, Film Formation, Adhesion, Surface Preparation and Contamination Control, Donald M. Mattox, Noyes Publications, 1998, pp. 127–135 and 343–364.*

Bates, J.B., et al. "Preferred Orientation of Polycrystalline $LiCoO_2$ Films" *Journal of the Electrochemical Society*; Issue No. 147 (1) pp. 59–70 (2000).

Roh N–S, et al., "Effects of deposition condition on the ionic conductivity and structure of amorphous lithium phosphorus oxynitrate thin film" Scripta Materialia, Dec. 17, 1999, pp. 43–49, vol. 42, No. 1, Elsevier, New York, NY, US.

Bolster M–E, et al. "Investigation of lithium intercalation metal oxides for thermal batteries" Proceedings of the International Power Sources Symposium, Cherry Hill, Jun. 25–28, 1990; Jun. 25, 1990, pp. 138–140, vol. SYMP. 34, IEEE, New York, US.

Wagner A V, et al. "Fabrication and testing of thermoelectric thin film devices" Fifteenth International Conference on Thermoelectrics, Pasadena, CA, USA Mar. 26–29, 1996; pp. 269–273, IEEE, New York, US.

U.S. Provisional Patent Application entitled, "Comprehensive Patent for the Fabrication of a High Volume, Low Cost Energy Products Such as Solid State Lithium Ion Rechargable Batter, Supercapacitators and Fuel Cells"; filed Mar. 24, 2000; Ser. No. 60/191,174, Inventors: Jenson, et al.

U.S. Provisional Patent Application entitled "Apparatus and Method for Rechargeable Batteries and for Making and Using Batteries"; filed Aug. 14, 2000, Ser. No. 60/225,134, Inventor: Jenson.

U.S. Provisional Patent Application entitled "Battery Having Ultrathin Electrolyte", filed Oct. 6, 2000, Ser. No. 60/238,673; Inventor: Jensen, et al.

Neudecker, et al., "Lithium–Free Thin–Film Battery with In–Situ Plated Li Anode", Journal of the Electrochemical Society, Issue No. 147(2) 517–523 (2000).

* cited by examiner

*Primary Examiner*—Patrick Ryan
*Assistant Examiner*—Julian Mercado
(74) *Attorney, Agent, or Firm*—Janah & Associates; Ashok K. Janah

(57) ABSTRACT

A method of depositing lithium phosphorus oxynitride on a substrate, the method comprising loading a substrate into a vacuum chamber having a target comprising lithium phosphate, introducing a process gas comprising nitrogen into the chamber and maintaining the gas at a pressure of less than about 15 mTorr; and forming a plasma of the process gas in the chamber to deposit lithium phosphorous oxynitride on the substrate.

12 Claims, 3 Drawing Sheets

US 6,863,699 B1

SPUTTER DEPOSITION OF LITHIUM PHOSPHOROUS OXYNITRIDE MATERIAL

BACKGROUND

In thin film batteries, a solid state electrolyte is disposed between an anode and cathode. A suitable electrolyte comprises lithium phosphorous oxynitride material which may be deposited on a substrate by radio frequency sputtering of a lithium phosphate target in a nitrogen gas, as for example, disclosed in U.S. Pat. No. 5,597,660, and U.S. Pat. No. 5,512,147 which are incorporated herein by reference in their entireties. In the deposition process, a sufficient amount of nitrogen species have to be incorporated into the electrolyte to provide a good Li ion conductivity and good chemical stability. Because the incorporation efficiency of nitrogen is relatively low, the electrolyte is typically deposited in a relatively high pressure nitrogen atmosphere, typically at pressures of 20 mTorr or higher. However, the high nitrogen gas pressure lowers the deposition rates obtained during the sputtering process. The high gas pressure may also render the plasma relatively unstable and difficult to control.

Thus it is desirable to obtain good deposition rates for depositing lithium phosphorous oxynitride material. It is also desirable to obtain a stable and easy to control plasma during the sputtering process.

SUMMARY

The present invention satisfies these needs and provides a method to deposit lithium phosphorous oxynitride material. In one aspect, the present invention comprises a method of depositing lithium phosphorus oxynitride on a substrate, the method comprising loading a substrate into a vacuum chamber having a target comprising lithium phosphate, introducing a process gas comprising nitrogen into the chamber and maintaining the gas at a pressure of less than about 15 mTorr; and forming a plasma of the process gas in the chamber to deposit lithium phosphorous oxynitride on the substrate.

In another aspect, a method of forming a thin film battery comprises selecting a substrate, forming a first current collector on a substrate, forming first electrodes on the first collector, forming an electrolyte on the first electrode, the electrolyte comprising lithium phosphorous oxynitride deposited from a lithium phosphate target in a plasma of a nitrogen gas maintained at a pressure of less than about 15 mTorr, forming a second electrode on the electrolyte, and forming a second current collector on the second electrode.

In another aspect, a thin film battery comprises a substrate, a first current collector on the substrate, a first electrode on the first current collector, an electrolyte on the first electrode, the electrolyte comprising lithium phosphorous oxynitride, and the electrolyte having a conductivity of at least about $2 \times 10^{-6}$ S/cm, a second electrode on the electrolyte, and a second current collector on the second electrode.

DRAWINGS

These and other features, aspects, and advantages of the present invention will become better understood with reference to the following description, appended claims, and accompanying drawings, which illustrate embodiments of the present invention that may be used separately or in combination with one another, where:

FIG. 2b is a schematic side view of the apparatus of FIG. 2a;

FIG. 3 is a schematic detailed side view of a magnetron sputtering cathode facing a substrate in the apparatus of FIG. 2a;

Figure 4:
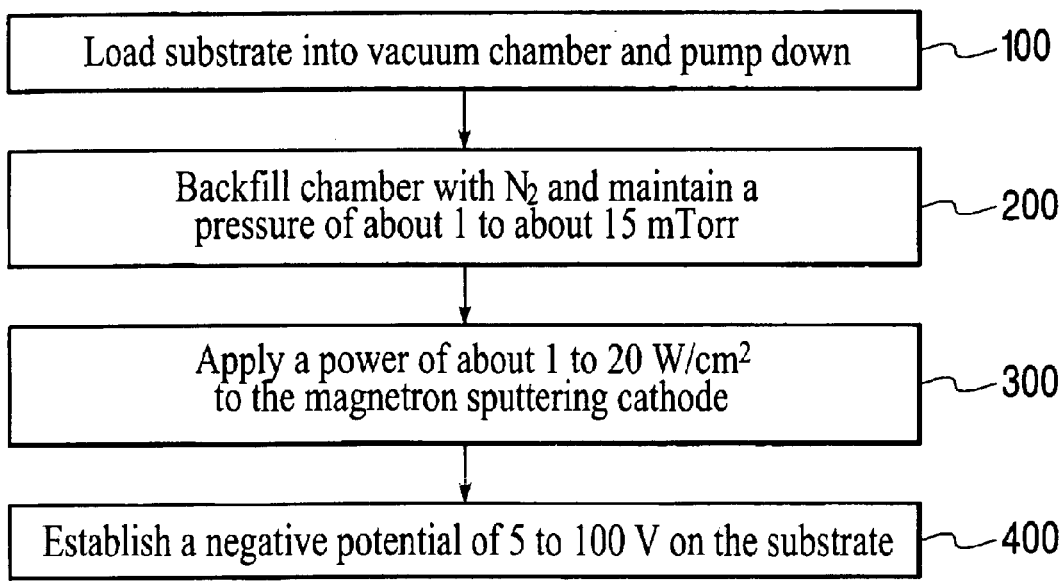
Figure 5:
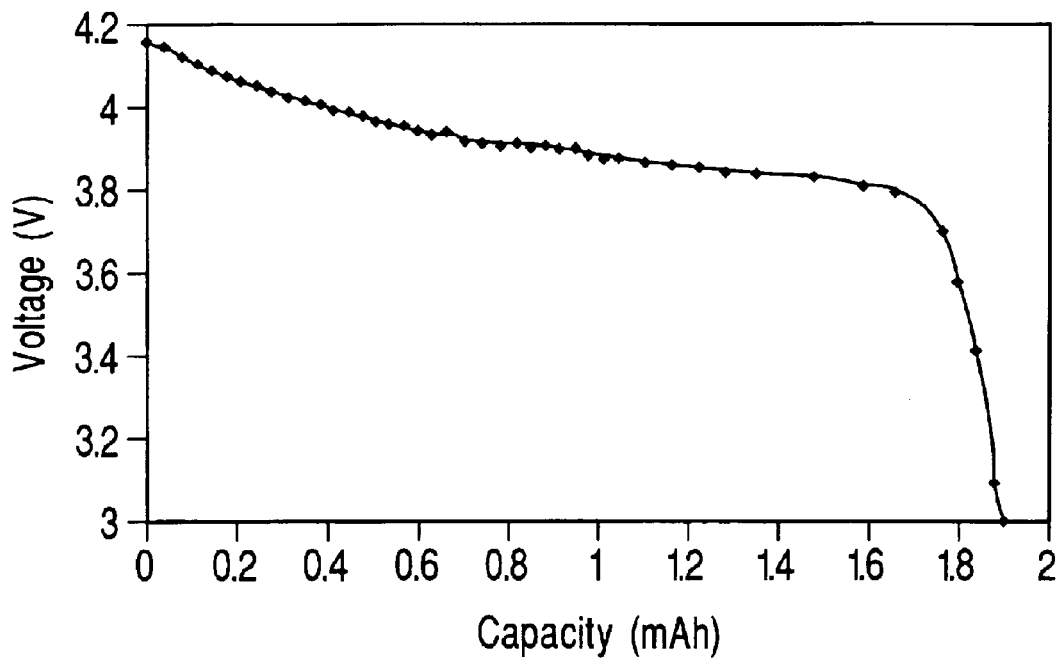

FIG. 4 is a flow chart of an embodiment of a method of sputtering lithium phosphorous oxynitride material on a substrate according to the present invention; and FIG. 5 is a typical discharge curve of an embodiment of a thin film battery according to the present invention, the battery comprising a 15 cm$^2$ area, a 2-$\mu$m thick crystalline LiCoO$_2$ cathode, and a 1.5 $\mu$m thick lithium phosphorous oxynitride film.

DESCRIPTION

Figure 1:
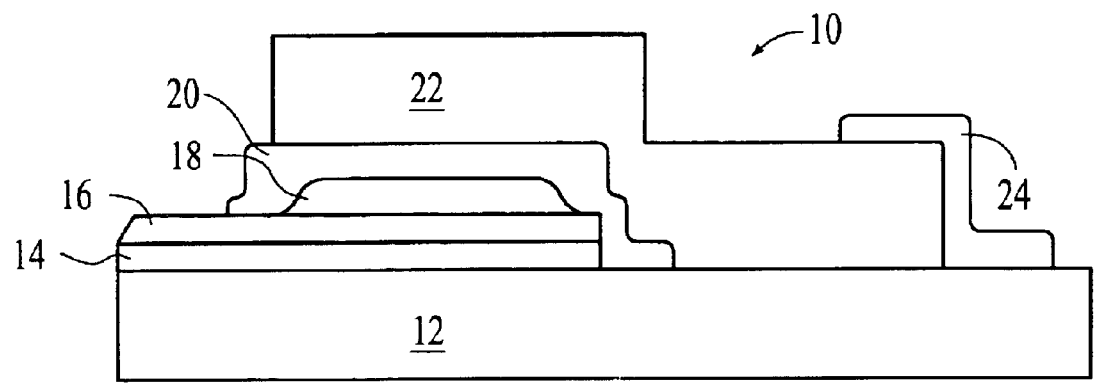
FIG. 1 is a schematic cross-sectional view of an embodiment of a thin film battery according to the present invention.

An embodiment of a thin film device, such as a battery 10, according to the present invention, is illustrated in FIG. 1. Typically, the battery 10 is formed on a substrate 12 which can be an insulator, semiconductor or conductor. The substrate 12 is made from a material that has good mechanical strength at processing or operational temperatures. For example, the substrate 12 can comprise silicon dioxide, aluminum oxide, oxidized silicon, titanium or plastics. In one version, the substrate 12 comprises a thickness of less than about 100 microns and more preferably less than 25 microns. Subsequently, layers for a thin film battery are deposited on the substrate 12 using, for example, CVD, PVD and other processes. While the invention is illustrated in the form of a battery, it should be noted that other thin film devices are also encompassed by the present invention, such as for example, active or passive electronic devices, for example, a capacitor; and the present invention should not be limited to the exemplary versions illustrated herein.

The battery 10 includes a first current collector film 16 formed over an adhesion layer 14 deposited on the substrate 12. The adhesion layer 14 is provided to improve adhesion between the current collector and the substrate 12, and may comprise a metal such as, for example, titanium, cobalt, aluminum, other metals, or ceramic materials such as, for example, LiCoO$_x$. The first current collector film 16 is typically a conductive metal layer which can comprise metals such as silver, gold, platinum or aluminum. The first current collector 16 can also comprise the same metal as the adhesion layer 14 but is generally thicker to provide sufficient electrical conductance.

A first electrode 18 comprising an electrochemically active material is deposited over the first current collector 16. By way of example, the first electrode 18 can comprise amorphous vanadium pentoxide, V$_2$O$_5$, or one of several lithium containing intercalation compounds that can be deposited as thin films, such as crystalline TiS$_2$, Li$_x$Mn$_2$O$_2$, or in one exemplary of an embodiment of the present invention, crystalline Li$_x$CoO$_2$ film. The crystalline Li$_x$CoO$_2$ may be deposited upon the first current collector 16 by RF or DC magnetron sputtering as for example disclosed in commonly assigned U.S. application Ser. No. 09/656,012, entitled 'Thin Film Battery and Method of Manufacture by Krasnov, et al., which is incorporated herein by reference in its entirety. According to the present invention, an electrolyte 20 comprising lithium phosphorus oxynitride material is deposited on the first electrode 18 under the conditions described herein. A second electrode 22 is deposited over the electrolyte 20 and a second current collector 24 is deposited on the second electrode 22 and substrate 12. Further materials and layers can be deposited on the substrate to provide protection or for other applications.

Figure 2A:
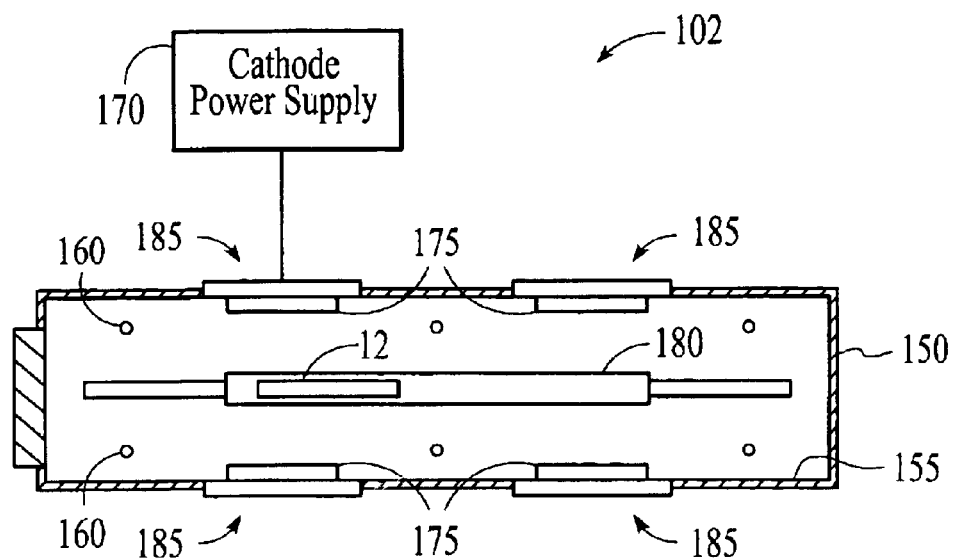
FIG. 2a is a schematic top view of an exemplary embodiment of a magnetron sputtering apparatus suitable for depositing thin films of the present invention.
Figure 2B:
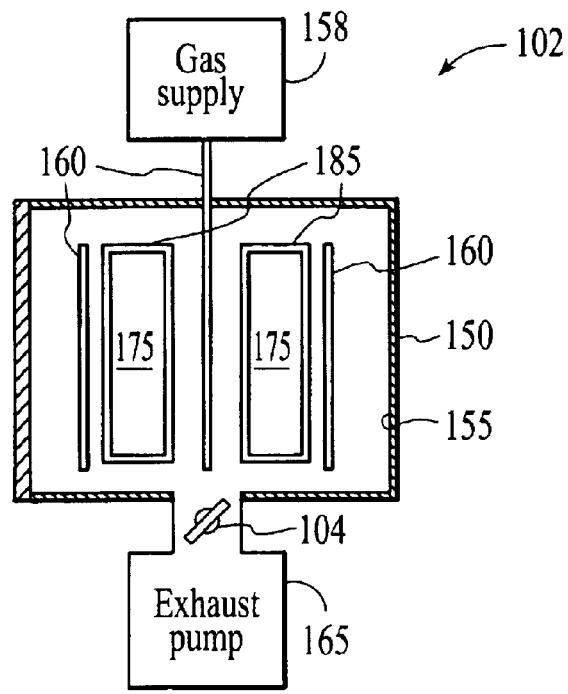

FIG. 4 illustrates an exemplary method by which an electrolyte film 20 comprising lithium phosphorus oxynitride may be sputter deposited on a substrate 12 in an apparatus 102. In an initial step 100, one or more substrates 12 are mounted on a support fixture 180 and transported into a vacuum chamber 150, an exemplary version of which is illustrated in FIGS. 2a and 2b. The vacuum chamber 150 is pumped down to about $1 \times 10^{-5}$ Torr by an exhaust pump 165, such as a cryogenic pump, through an opening having a baffle valve 104. The chamber 150 comprises walls 155 surrounding the support fixture 180, a gas supply 158 connected to a gas distributor 160 to provide process gas into the chamber 150, an exhaust pump 165 to exhaust the gas from the chamber and a cathode power supply 170 to apply a power to magnetron cathode 185 about the target 175. The substrate fixture 180 with each substrate 12 held thereon positioned facing a target 175 and electrically isolated from the chamber walls 155 which are typically electrically grounded. The process chamber 150 typically comprises a volume of about 16 sq ft and with multiple sputtering targets 175, for example, four targets, and an equivalent number of substrates 12.

Figure 3:
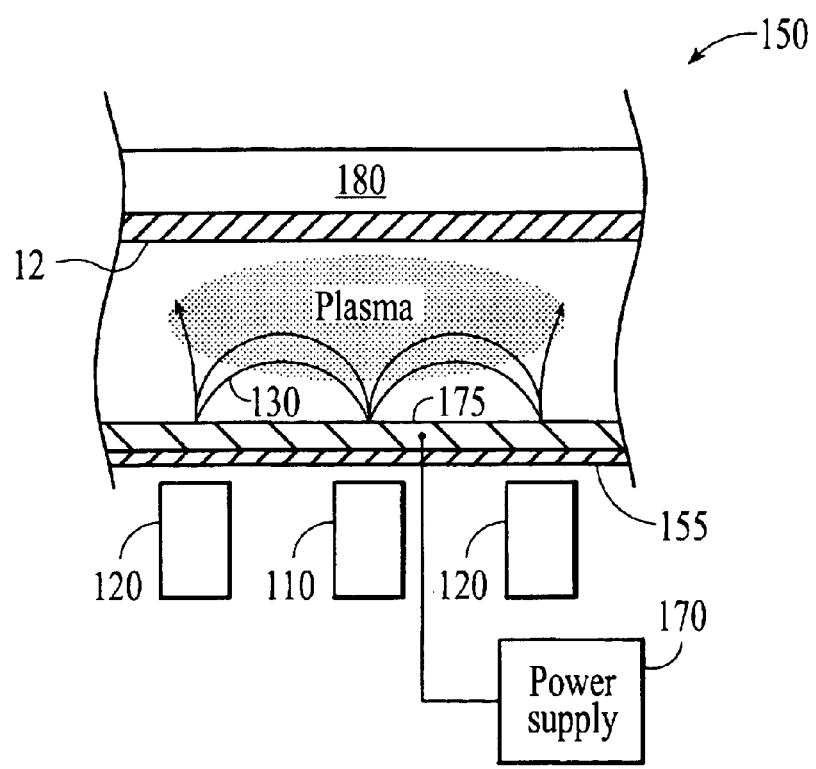

A high density plasma is generated in the chamber 150 by each portion of the magnetron cathode 185 over an area that is sufficiently large to coat each substrate 12. In one version, the magnetron cathode 185 comprises central magnets 110 that provide a weak magnetic field relative to surrounding peripheral magnets 120 that provide a stronger magnetic field, as for example, shown in FIG. 3. For example, the central magnets may provide a magnetic field strength of about 900 Gauss and the peripheral magnets a magnetic field strength of 2000 Gauss. The peripheral and central magnets 110, 120 may also have opposing polarity with, for example, the central magnets having their south pole facing the chamber 150 and their north pole facing away from the chamber 150; and the peripheral magnets having their north pole facing the chamber 150 and south pole facing away from the chamber 150; or vice versa. In this configuration, the magnetic field 130 generated by the magnets 120 is not confined to near the surface of the magnetron cathode 185 but they extend to near the substrate 12. It is believed that secondary electrons follow the magnetic field lines that reach near the substrate surface to generate a high-density plasma in this region that extracts gaseous ions present in the plasma to the substrate surface.

Thereafter, nitrogen gas is introduced in the chamber, per step 200, typically at a flow rate of from about 100 to 300 sccm for a chamber volume of about 300 liter, but other equivalent flow rates may be used depending on the volume of the processing chamber and the pumping speed. The nitrogen gas in the chamber may be maintained at a pressure of less than about 15 mTorr, and preferably at least about 1 mTorr, which are both less than conventional gas pressures. The lower gas pressure was found to advantageously provide higher deposition rates for the sputter deposition of lithium phosphorous oxynitride material. In addition, the plasma was determined to be more stable and with fewer glow discharge fluctuations. It is believed that the magnetron sputtering deposition process generates a high plasma density that allows nitrogen to be efficiently incorporated into the electrolyte material. The lower gas pressure also improves the deposition rate compared to conventional processes. In addition, the amount of nitrogen incorporated into the deposited electrolyte is sufficient to provide a good Li-ion conductivity value for the electrolyte material of at least about $2 \times 10^{-6}$ S/cm.

In operation, a target 175 comprising lithium phosphate $(Li_3PO_4)$ is installed in the chamber 150 and the magnetron-sputtering cathode 185 may be operated at a power density level of from about 1 to about 20 W/cm$^2$, as in step 300. The magneton sputtering cathode 185 when operating at these power levels causes an ion flux of 0.1 to 5 mA/cm$^2$ from the high density plasma to the substrate 12. During the sputtering process, a negative potential of from about 5 V to about 200 V, or from at least about 5 V to less than about 100 V is applied to the substrate 12 by charging the support fixture 180 as provided in step 400. The potential can be established either by applying power from an external power supply or simply by electrically floating the support fixture 180. The parameters of the sputtering process are maintained until a desired thickness of sputtered film is obtained. When the sputtering cathode 185 is operated at a power density of about 1 W/cm$^2$, deposition rate of 0.1 mm/hr was obtained for a gas pressure of 10 mTorr nitrogen, 0.24 mm/hr for 5 m of nitrogen, and 0.18 mm/hr for 1 mTorr of nitrogen. Thus, it was d lined that the electrolyte deposition rate increases with decreasing nitrogen partial pressure when the nitrogen partial pressure is above certain level. The ionic conductivity remained unchanged through out the nitrogen partial pressure range disclosed above. The temperature of the substrate 12 during sputter deposition is estimated to be between 100 and 200° C.

FIG. 5 shows a typical discharge curve of a thin film battery having an area of 15 cm$^2$. The thickness of the first electrode layer $Li_xCoO_2$ is close to 2 μm and the capacity is about 1.9 mAh. From these numbers, the energy density and specific energy of this thin film battery, including both the cell and the substrate, was determined to be about 340 wh/L and about 105 wh/kg, respectively.

In another aspect of the present invention, an energy density of more than 700 wh/L and a specific energy of more than 250 wh/Kg may be achieved by fabricating battery cell on both sides of a mica substrate, as for example, disclosed in aforementioned U.S. patent application Ser. No. 09/656, 012. In this embodiment, which may be used by itself, or in combination with any of the other features or methods described herein, the substrate 12 comprises a thickness of less than about 100 microns and more preferably less than 25 microns. The thinner substrate 12 reduces the total weight and volume of the battery and yet is sufficiently strong to provide the desired mechanical support for the battery structure. A preferred substrate material comprises mica, which may be fabricated into a thin substrate of less than 100 microns with good tensile, strength. Mica is typically a muscovite material, which is a layered silicate with a typical stoichiometry of KAl3Si3O10(OH)2. Mica typically has a flat six-sided monoclinical crystalline structure with good cleavage properties in the direction of the large planar surfaces. Because of this crystal structure, mica may be split into thin foils along its cleavage direction to provide thin substrates having surfaces which are smoother than most chemically or mechanically polished surfaces, which is advantageous for the fabrication of thin films on the substrate. Chemically, mica is stable and inert to the action of most acids, water, alkalies and common solvents. Electrically, mica has good dielectric strength, a uniform dielectric constant, and low electrical power loss factors. Mica is also stable at high temperatures of up to 600° C. By using mica, thin substrates may be fabricated to provide lighter and smaller batteries with relatively higher energy density levels. Mica also provides good physical and chemical characteristics for processing of the thin films formed on the substrate 12.

The present invention has been described in considerable detail with reference to certain preferred versions thereof; however, the spirit and scope of the appended claims should not be limited to the description of the preferred versions contained herein.

What is claimed is:

1. A method of depositing lithium phosphorus oxynitide on a substrate, the method comprising:
   (a) loading a substrate into a vacuum chamber having a target comprising lithium phosphate;
   (b) introducing a process gas comprising nitrogen into the chamber and maintaining the gas at a pressure of less than about 15 mTorr; and
   (c) forming a plasma of the process gas in the chamber that generates an ion flux to the substrate of at least 0.1 mA/cm$^2$ and less than 5 mA/cm$^2$ by;
      (i) maintaining the substrate at a negative potential of from about 5 to about 200 V;
      (ii) biasing the target relative to an electrode in the chamber at a power level; and
      (iii) maintaining non-equal magnetic field strengths about the target,
   whereby the lithium phosphorous oxynitride deposited on the substrate has a lithium ion conductivity of at least about 2×10$^{-6}$ S/cm.

2. A method according to claim 1 comprising maintaining the process gas at a pressure of at least about 1 mTorr.

3. A method according to claim 1 wherein (c) (iii) comprises providing a central magnet that provides a magnetic field strength of about 900 Gauss and a peripheral magnet that provides a magnetic field strength of 2000 about Gauss.

4. A method according to claim 1 further comprising maintaining the substrate at a negative potential of at least about 5 V.

5. A method according to claim 1 further comprising providing a central magnet that provides a weaker magnetic field.

6. A method of forming a thin film battery, the method comprising:
   (a) selecting a substrate;
   (b) forming a first current collector on the substrate;
   (c) forming a first electrode on the first current collector;
   (d) forming an electrolyte on the first electrode, the electrolyte comprising lithium phosphorous oxynitride deposited from a lithium phosphate target in a plasma of a nitrogen gas maintained at a pressure of less than about 15 mTorr, the plasma providing an ion flux to the substrato of at least 0.1 mA/cm$^2$ and less than 5 mA/cm$^2$, and the plasma being formed by:
      (i) maintaining the substrate at a negative potential of from about 5 to about 200 V,
      (ii) biasing the lithium phosphate target relative to an electrode in the chamber at a power level, and
      (iii) maintaining non-equal magnetic field strengths about the target to thereby deposit lithium phosphorous oxynitride on the substrate having a lithium ion conductivity of at least about 2×10$^{-6}$ S/cm;
   (e) forming a second electrode on the electrolyte; and
   (f) forming a second current collector on the second electrode.

7. A method according to claim 6 wherein (d) comprises maintaining the process gas at a pressure of at least about 1 mTorr.

8. A method according to claim 6 wherein (d) comprises applying a power level to one or more magnetron sputtering electrodes.

9. A method according to claim 8 wherein the magnetron sputtering electrodes comprise a central magnet and a peripheral magnet.

10. A method according to claim 9 wherein the central and peripheral magnet have non-equal magnetic field strengths.

11. A method according to claim 10 wherein the central magnet provides a weaker magnetic field and the peripheral magnet provides a stronger magnetic field.

12. A method according to claim 6 wherein (d) comprises maintaining the substrate at a negative potential of at least about 5 V.

* * * * *